(12) United States Patent
Wang et al.

(10) Patent No.: US 11,770,948 B2
(45) Date of Patent: *Sep. 26, 2023

(54) ORGANIC LIGHT EMITTING COMPONENT, FABRICATION METHOD, AND DISPLAY DEVICE EACH HAVING ANTI-SHRINKAGE STOP STRUCTURES

(71) Applicant: BOE TECHNOLOGY GROUP CO., LTD., Beijing (CN)

(72) Inventors: Dawei Wang, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/549,837

(22) Filed: Dec. 13, 2021

(65) Prior Publication Data

US 2022/0102681 A1 Mar. 31, 2022

Related U.S. Application Data

(63) Continuation of application No. 16/301,669, filed as application No. PCT/CN2018/075624 on Feb. 7, 2018, now Pat. No. 11,233,219.

(30) Foreign Application Priority Data

Jul. 12, 2017 (CN) ...................... 201710566854.X

(51) Int. Cl.
*H10K 50/844* (2023.01)
*H10K 59/12* (2023.01)
*H10K 71/00* (2023.01)

(52) U.S. Cl.
CPC ........... *H10K 50/844* (2023.02); *H10K 59/12* (2023.02); *H10K 71/00* (2023.02); *H10K 59/1201* (2023.02)

(58) Field of Classification Search
CPC . H01L 51/56; H01L 27/3244; H01L 51/5253; H10K 50/844; H10K 59/12
See application file for complete search history.

(56) References Cited

U.S. PATENT DOCUMENTS 9,391,296 B2 7/2016 Park et al.
9,647,233 B2 5/2017 Kim et al.
(Continued)

FOREIGN PATENT DOCUMENTS

CN 103904253 A 7/2014
CN 104425760 A 3/2015
(Continued)

OTHER PUBLICATIONS

International Search Report and Written Opinion issued in PCT/CN2021/075624 dated May 9, 2018 with English translation, (6p).
(Continued)

*Primary Examiner* — Michael Jung
(74) *Attorney, Agent, or Firm* — Arch & Lake LLP

(57) ABSTRACT

An organic light emitting component, including a substrate, an intermediate structure layer disposed on the substrate. The intermediate structure layer includes a display area and a non-display area at a periphery of the display area. The intermediate structure layer further includes a planarization layer, and an anti-shrinkage stop structure disposed at the non-display area and a display structure portion disposed at the display area are both disposed on the planarization layer and spaced apart from each other. The organic light emitting component includes a thin film encapsulation structure layer disposed on the surface of the intermediate structure layer facing away from the substrate. The anti-shrinkage stop structure is disposed between the thin film encapsulation
(Continued)

structure layer and the planarization layer, and a free end of the anti-shrinkage stop structure extends into the thin film encapsulation structure layer.

20 Claims, 11 Drawing Sheets

(56) References Cited

U.S. PATENT DOCUMENTS

| | | |
|---|---|---|
| 2006/0113900 A1 | 6/2006 | Oh |
| 2015/0060806 A1 | 3/2015 | Park et al. |
| 2015/0263309 A1 | 9/2015 | Hong |
| 2015/0372253 A1 | 12/2015 | Hong et al. |
| 2016/0013222 A1 | 1/2016 | Park et al. |
| 2016/0035761 A1 | 2/2016 | Kwon et al. |
| 2016/0268540 A1 | 9/2016 | Kim et al. |
| 2016/0285045 A1 | 9/2016 | Park et al. |
| 2017/0345881 A1 | 11/2017 | Kim et al. |
| 2018/0061728 A1 | 3/2018 | Chen et al. |
| 2018/0151838 A1 | 5/2018 | Park et al. |
| 2018/0205037 A1* | 7/2018 | Kim ............... H01L 27/3276 |
| 2018/0287093 A1 | 10/2018 | Lee et al. |
| 2019/0074479 A1 | 3/2019 | Lee et al. |

FOREIGN PATENT DOCUMENTS

| | | |
|---|---|---|
| CN | 106601781 A | 4/2017 |
| CN | 106816551 A | 6/2017 |
| CN | 107146858 A | 9/2017 |
| CN | 107768402 A | 3/2018 |
| JP | 2006171745 A | 6/2006 |
| JP | 2007101713 A | 4/2007 |
| JP | 2015010257 A | 1/2015 |

OTHER PUBLICATIONS

First Office Action issued to Chinese Application No. 201710566854.X dated Apr. 25, 2018 with English translation, (12p).

Non-Final Office Action issued in U.S. Appl. No. 16/301,669, dated May 20, 2021, (23p).

The Notice of Allowance issued to U.S. Appl. No. 16/301,669, dated Sep. 15, 2021, (10p).

* cited by examiner

ORGANIC LIGHT EMITTING COMPONENT, FABRICATION METHOD, AND DISPLAY DEVICE EACH HAVING ANTI-SHRINKAGE STOP STRUCTURES

CROSS REFERENCE TO RELATED APPLICATIONS

The present application is a continuation of U.S. patent application Ser. No. 16/301,669 filed on Nov. 14, 2018, which is based upon International Application No. PCT/CN2018/075624, filed on Feb. 7, 2018, which claims priority to Chinese Patent Application No. 201710566854.X, entitled "ORGANIC LIGHT EMITTING COMPONENT, FABRICATION METHOD THEREOF, AND DISPLAY DEVICE", filed on Jul. 12, 2017, the entire contents of all of which are incorporated by reference for all purposes.

TECHNICAL FIELD

The present disclosure relates to an organic light emitting component and a method for fabricating the same. The present disclosure also relates to a display device having the organic light emitting component.

BACKGROUND

For an organic light emitting display device, in the film encapsulation process, the organic layer is usually an ultraviolet-curable organic material, and the organic layer can usually be formed between a first inorganic layer and a second inorganic layer by inkjet printing. The organic light emitting display device generally includes a display area and a non-display area, and generally, a boundary between the display area and the non-display area is a boundary of the organic light emitting layer. There is a phenomenon of a convex film layer structure at the edge of the organic layer, and a desirable solution has not been proposed yet.

The above information disclosed in this Background section is only for better understanding of the background of the present disclosure, and thus it may include information that does not constitute related art known to those of ordinary skill in the art.

SUMMARY

The present disclosure provides an organic light emitting component, and a fabricating method of the organic light emitting component.

According to a first aspect of the present disclosure, there is provided an organic light emitting component. The organic light emitting component includes a substrate, an intermediate structure layer and a thin film encapsulation structure. The substrate includes a first surface. The intermediate structure layer is disposed on the first surface of the substrate. The intermediate structure layer includes a display area and a non-display area at a periphery of the display area. The display area is provided with a display structure portion. The non-display area is provided with one or more anti-shrinkage stop structures. The intermediate structure layer further includes a planarization layer. The anti-shrinkage stop structure and the display structure portion are both disposed on the planarization layer and spaced apart from each other. The organic light emitting component includes a thin film encapsulation structure layer located on a surface of the intermediate structure layer facing away from the substrate. The anti-shrinkage stop structure is disposed between the thin film encapsulation structure layer and the planarization layer, and a free end of the anti-shrinkage stop structure extends into the thin film encapsulation structure layer. The display structure portion includes a pixel defining layer, an organic light emitting layer, a cathode layer and a first inorganic structure layer, which are sequentially stacked. The pixel defining layer is disposed on the planarization layer, and the organic light emitting layer is disposed on a surface of the pixel defining layer facing away from the planarization layer.

According to a second aspect of the present disclosure, there is provided a display device, including the organic light emitting component provided by the first aspect present disclosure.

According to a third aspect of the present disclosure, there is provided a method for fabricating an organic light emitting component as disclosed in the first aspect. The method for fabricating the organic light emitting component includes forming a planarization layer on the substrate. The method includes forming a display structure portion and one or more anti-shrinkage stop structures at a periphery of the display structure portion with an interval on the planarization layer. The method includes forming a thin film encapsulation structure layer on the display structure portion and the one or more anti-shrinkage stop structures.

It is to be understood that the foregoing general description and the following detailed description are exemplary and explanatory only and are not restrictive of the disclosure

BRIEF DESCRIPTION OF THE DRAWINGS

The various objects, features and advantages of the present disclosure will become more apparent from the Detailed Description of preferred arrangements of the present disclosure with reference to accompanying drawings. The drawings are only illustrative of the present disclosure and are not necessarily drawn to scale. In the drawings, the same reference numerals generally indicate the same or similar parts, among them.

DETAILED DESCRIPTION

Figure 1:
FIG. 1 is a schematic diagram showing the structure of an organic structure layer having a convex film layer structure at the edge in the related art.

Example arrangements will now be described more fully with reference to the accompanying drawings. However, the exemplary arrangements can be embodied in a variety of forms, and should not be construed as being limited to the arrangements set forth herein. Rather, the arrangements are provided to make the present disclosure complete and thorough, and to convey the concept of the exemplary arrangements to those skilled in the art. The same reference numerals in the drawings denote the same or similar structures, and thus their detailed description will be omitted.

Although the relative terms such as "above" and "below" are used in the specification to describe the relative relationship of one component to another component as illustrated, these terms are used in this specification for convenience only, for example, according to the directions illustrated in the accompanying drawings. It will be understood that if the device illustrated is flipped upside down, the component described as "above" will become the component "below". When a structure is "on" another structure, it is possible that a structure is integrally formed on another structure, or that a structure is "directly" disposed on another structure, or that a structure is "indirectly" disposed through another structure.

The terms "a", "an", "the", "said" are used to mean the presence of one or more elements/components/etc.; the terms "including" and "having" are used to mean the open type inclusively including or having and mean that there may be additional elements/components/etc. in addition to the listed elements/components/etc.; the terms "first", "second", etc. are used only for reference, rather than for limiting the number of the objects.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

Figure 2:
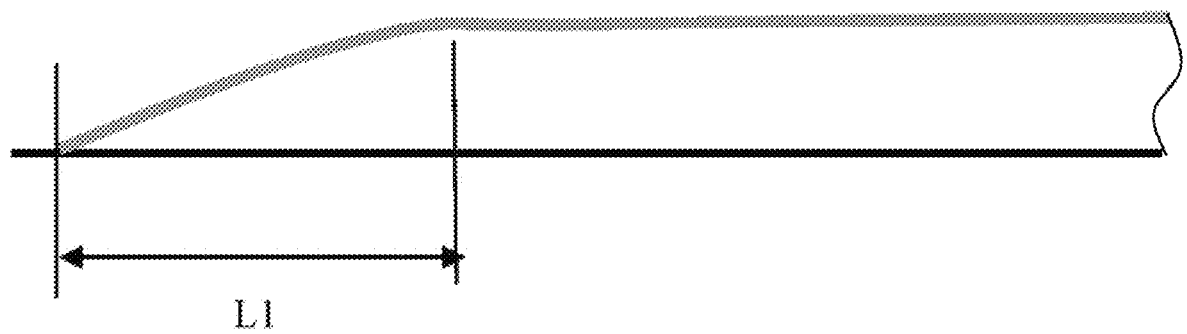
FIG. 2 is a schematic diagram showing the structure of an improved organic structure layer in the related art.
Figure 3:
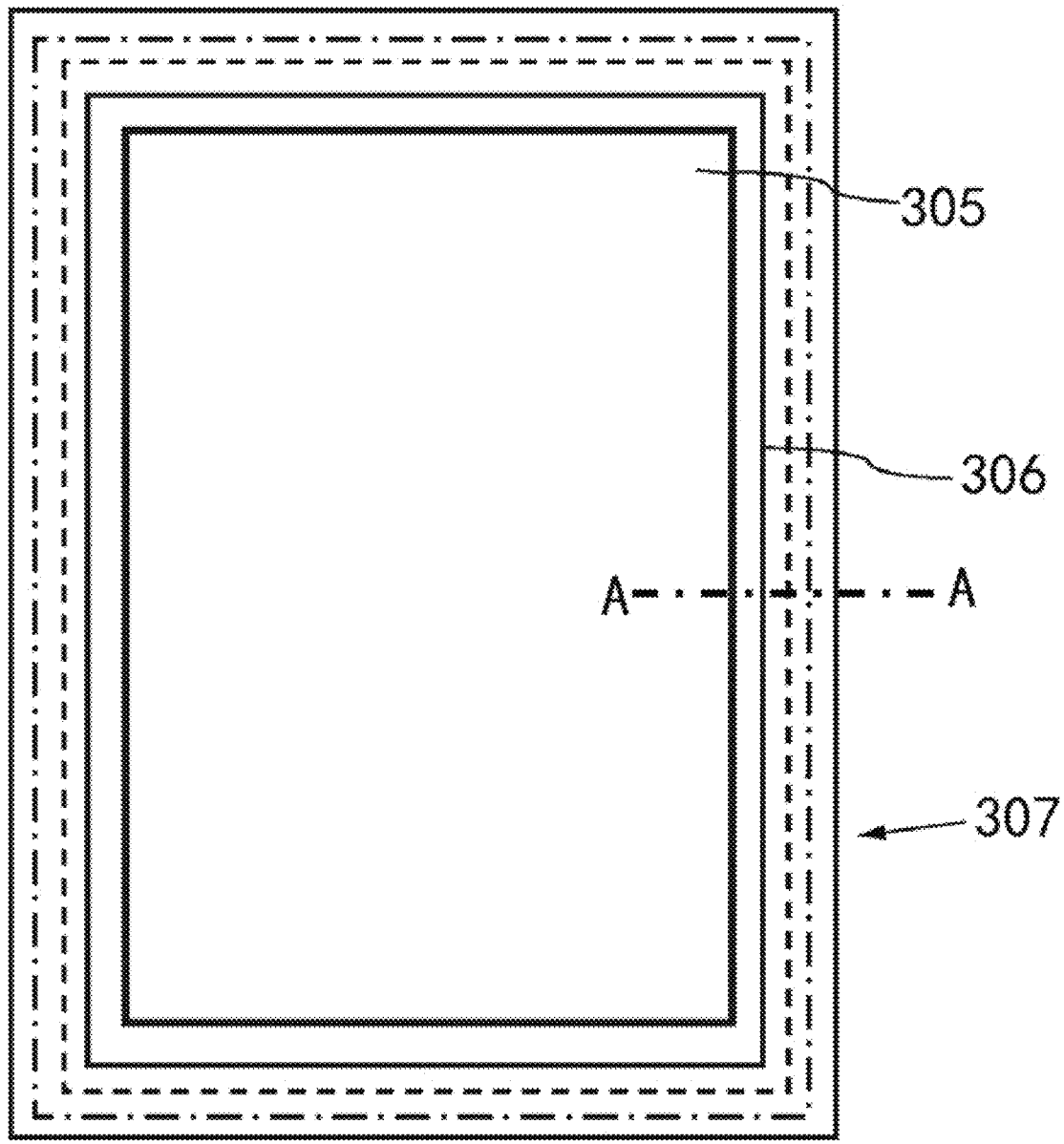
FIG. 3 is a schematic structural diagram of a top view of an organic structure component in the related art.
Figure 4:
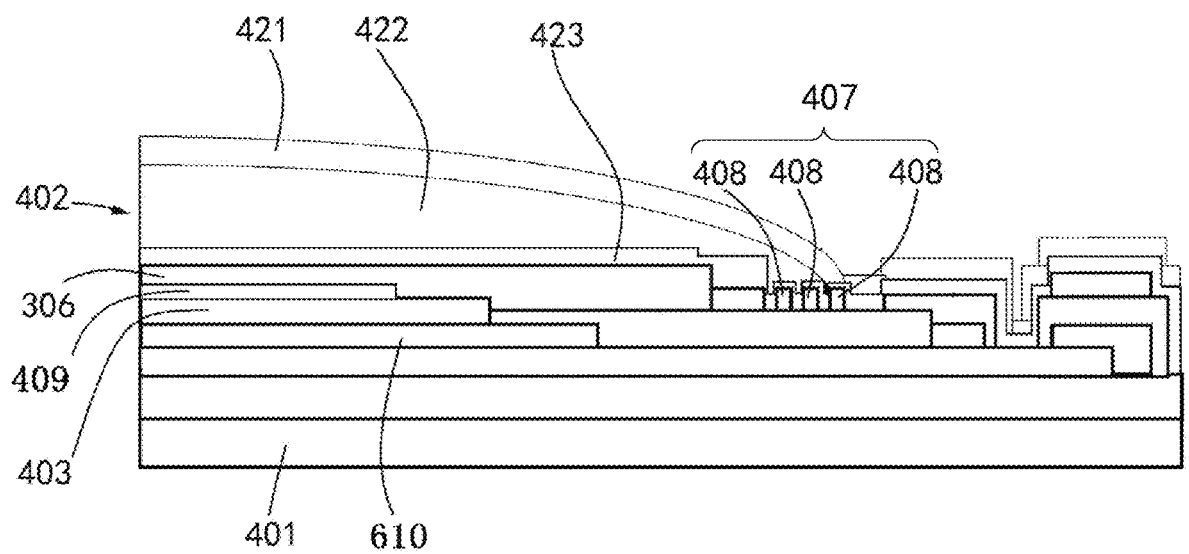
FIG. 4 is a cross-sectional view taken along line A-A of FIG. 3.

FIG. 1 is a schematic diagram showing the structure of an organic structure layer having a convex film layer structure at the edge in the related art. FIG. 2 is a schematic diagram showing the structure of the improved organic structure layer in the related art. The climbing distance L1 in FIG. 2 is greater than the climbing distance L2 in FIG. 1, for example, but not limited to, the climbing distance L1 may generally be greater than 1 mm. FIG. 3 is a schematic structural diagram of a top view of an organic structure component in the related art. FIG. 4 is a cross-sectional view taken along line A-A of FIG. 3.

Figure 5:
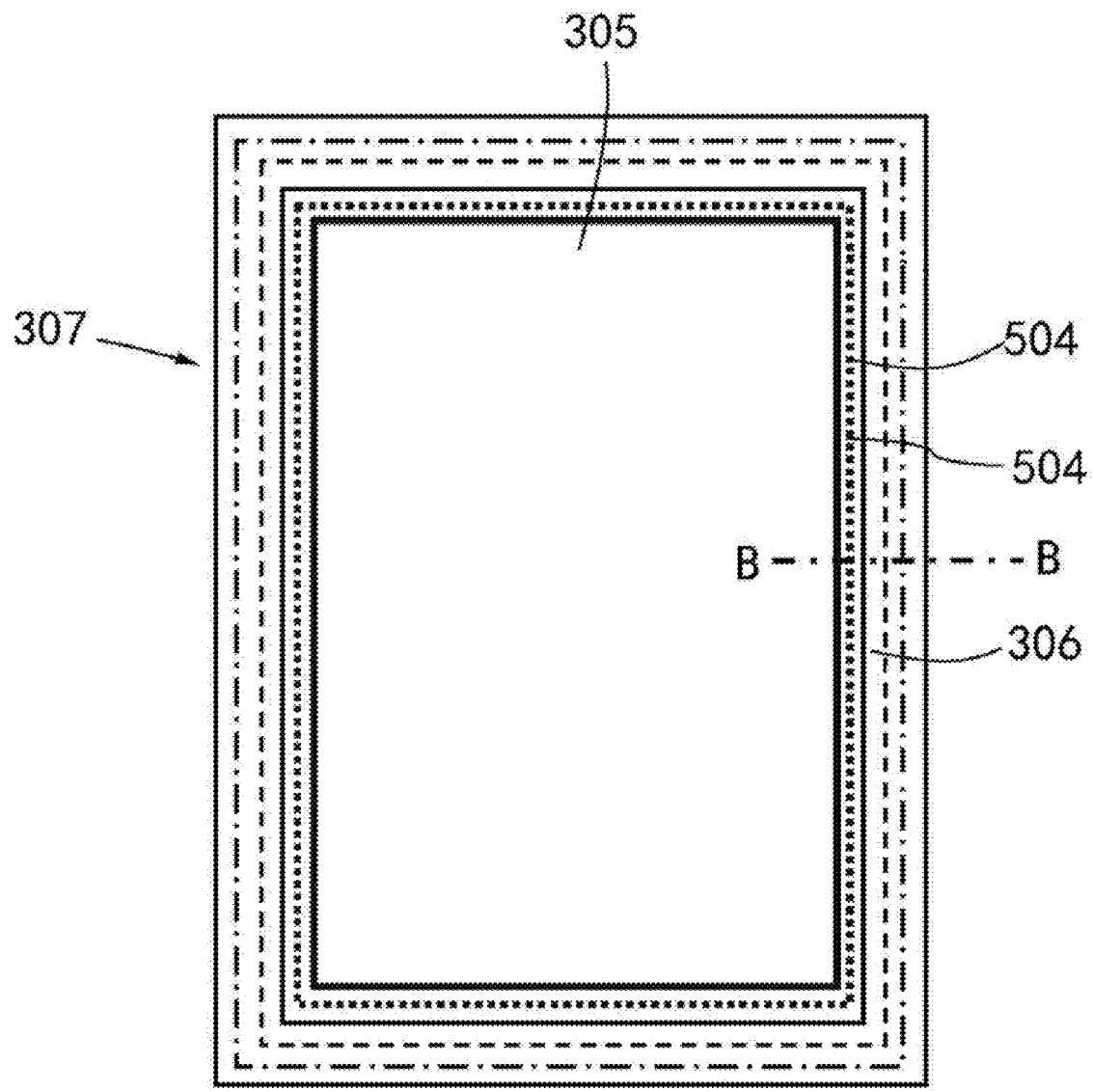
FIG. 5 is a schematic structural diagram of a top view of an organic structure component according to one or more examples of the present disclosure.
Figure 6:
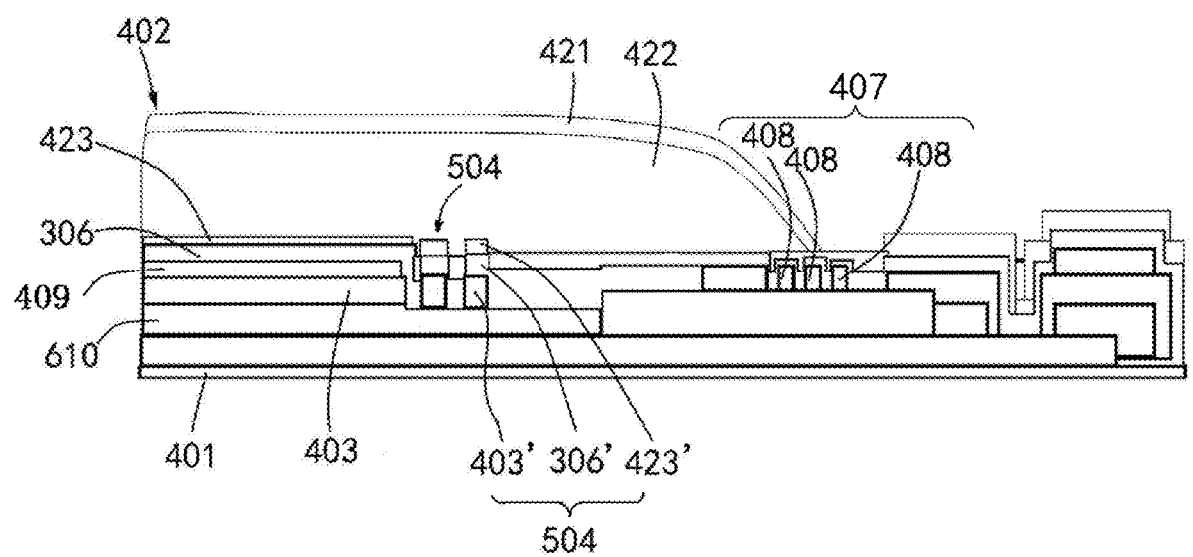
FIG. 6 is a cross-sectional view taken along line B-B of FIG. 5.

FIG. 5 is a schematic structural diagram of a top view of an organic structure component, according to an exemplary arrangement. FIG. 6 is a cross-sectional view taken along line B-B of FIG. 5.

Referring to FIGS. 5 and 6, according to an aspect of the present disclosure, there is provided an organic light emitting component. The organic light emitting component may include a substrate 401, a thin film encapsulation structure layer 402, and an intermediate structure layer disposed between the substrate 401 and the thin film encapsulation structure layer 402. The substrate 401 has a first surface. The thin film encapsulation structure layer 402 may include a second inorganic structure layer 421 and an organic structure layer 422. The intermediate structure layer may be disposed on the first surface, and the intermediate structure layer may have a display area 305 and a non-display area 307, and the non-display area 307 may be disposed at a periphery of the display area 305 to surround the display area 305. That is, the non-display area 307 may be an annular structure that surrounds the outer periphery of the display area 305. The display area 305 is provided with a display structure portion, and the non-display area 307 is provided with an anti-diffusion stop structure 407 and an anti-shrinkage stop structure 504. The anti-diffusion stop structure 407 surrounds the display area 305. The anti-shrinkage stop structure 504 is disposed between the display area 305 and the anti-diffusion stop structure 407. The anti-diffusion stop structure 407 can include a plurality of barrier blocks 408 spaced apart from each other. The plurality of barrier blocks 408 can enclose at least one circle, and the adjacent two circles are spaced apart from one another, for example, enclosing one or more rectangles.

With continued reference to FIGS. 5 and 6, according to an arrangement of the present disclosure, the intermediate structure layer may include a planarization layer 610, and the display structure portion and the anti-shrinkage stop structure 504 are both disposed on the planarization layer 610 and spaced apart from each other. The anti-shrinkage stop structure 504 can be an annular structure that can be disposed around a periphery of the display structure, and the pixel defining layer 403 and the anti-shrinkage stop structure 504 can be out of contact. According to an arrangement of the present disclosure, wherein the number of the anti-shrinkage stop structure 504 may be multiple, and a plurality of annular anti-shrinkage stop structures 504 may be sequentially spaced around the periphery of the pixel defining layer 403. According to an arrangement of the present disclosure, the anti-shrinkage stop structure 504 may be 1 to 5 circles, but not limited thereto, and may be adjusted according to the material properties of the organic structure layer 422. According to an arrangement of the present disclosure, wherein the pixel defining layer 403 and the anti-shrinkage stop structure 504 may respectively include a first side surface and a second side surface facing away from the thin film encapsulation structure layer 402, the first side surface and the second side surface are in the same plane, and the pixel defining layer 403 can be formed by the first side surface protruding toward the thin film encapsulation structure layer 402. The anti-shrinkage stop structure 504 can be formed by the second side surface protruding toward the thin film encapsulation structure layer 402, and the protruding end of the anti-shrinkage stop structure 504 is a free end, the freed end extends into the organic structure layer 422. According to an arrangement of the present disclosure, the anti-shrinkage stop structure 504 may extend in a direction perpendicular to the thin film encapsulation structure layer 402, but not limited thereto, and an angle between the extension direction of the anti-shrinkage stop structure 504 and the plane the thin film encapsulation structure layer 402 is located may be selected according to actual needs, all of which falls within the protection scope of the present disclosure.

With continued reference to FIGS. 5 and 6, according to an arrangement of the present disclosure, the display structure portion may include a pixel defining layer 403, an organic light emitting layer 409, a cathode layer 306, and a first inorganic structure layer 423, which are sequentially stacked. The defining layer 403 may be disposed on the planarization layer 610, and the organic light emitting layer 409 may be disposed on a surface of the pixel defining layer 403 facing away from the planarization layer 610, the cathode layer 306 may be disposed on the organic light emitting layer 409, and projection of the cathode layer 306 on the substrate 401 is greater than the projected area of the organic light emitting layer 409 on the substrate 401, such that the cathode layer 306 completely covers the surface of organic light emitting layer 409. According to an arrangement of the present disclosure, the first inorganic structure layer 423 is disposed on a surface of the cathode layer 306 facing away from the organic light emitting layer 409.

With continued reference to FIGS. 5 and 6, the anti-shrinkage stop structure 504 may be formed by the planarization layer 610 outwardly protruding to make it possible to be inserted into the organic structure layer 422. During the ultraviolet light irradiation on the organic structure layer 422, the anti-shrinkage stop structure 504 can prevent the organic structure layer 422 located at the edge from being gathered together to the central portion to form a convex film layer structure, so as to effectively forbid the edge of the organic structure layer 422 from shrinking toward the display region 305, thus making the thin film encapsulation structure layer 402 of the organic light emitting component more flat without increasing the climb distance. The organic light emitting component provided by the present disclosure can allow the organic structure layer 422 to have a desirable thickness in the display region 305 and can remain flat. The anti-shrinkage stop structure 504 can well block the flow of the ink before the curing of the organic structure layer 422 in the thin film encapsulation structure layer 402, so that the flow distance of the ink can be significantly reduced. Compared to the related art in which the anti-shrinkage stop structure 504 is not provided, the flow distance of the ink of the organic light emitting component of the present disclosure can be reduced from conventional 150 µm to 70 µm. According to an arrangement of the present disclosure, the anti-shrinkage stop structure 504 may be configured as a closed annular structure, and the display area may be surrounded in the inner side of the annular shape of the anti-shrinkage stop structure 504.

With continued reference to FIGS. 5 and 6, according to an arrangement of the present disclosure, the anti-shrinkage stop structure 504 may include a pixel defining layer portion 403', a cathode layer portion 306', and a first inorganic structure layer portion 423' that are sequentially stacked. The pixel defining layer portion 403' may be disposed on the planarization layer 610, and the cathode layer portion 306' may be disposed on the surface of the pixel defining layer portion 403' facing away from the planarization layer 610.

According to an arrangement of the present disclosure, the display structure portion may be disposed in the display area. The pixel defining layer portion 403' may be disposed in the same layer as the pixel defining layer 403, and the same material may be selected for both. According to an arrangement of the present disclosure, the cathode layer 306 may be disposed in the same layer as the cathode layer portion 306', and the same material may be selected for both. According to an arrangement of the present disclosure, the first inorganic structure layer portion 423' and the first inorganic structure layer 423 may be disposed in the same layer, and the same material may be selected for both, all of which are within the protection scope of the present disclosure.

Referring to FIGS. 4 and 6, according to an arrangement of the present disclosure, the organic light emitting component of the present disclosure may include an anti-diffusion stop structure 407 disposed in the non-display area, which may extend vertically outward from the surface of the anode layer. In the process of coating the thin film encapsulation structure layer 402, the ink may be prevented from diffusing to the outer periphery, and the anti-diffusion stop structure 407 may define the thickness of the thin film encapsulation structure layer 402.

With continued reference to FIGS. 5 and 6, according to an arrangement of the present disclosure, a thin film encapsulation structure layer 402 can be disposed on a side surface of the intermediate structure layer that faces away from the first surface for encapsulating the intermediate structure layer. According to an arrangement of the present disclosure, the anti-shrinkage stop structure 504 may extend from the surface of the planarization layer 610 facing away from the substrate 401 toward the thin film encapsulation structure layer 402, but not limited thereto, and the anti-shrinkage stop structure 504 may also be disposed at other locations such as, but not limited to, an ILD layer, or an SD layer, or a PLN layer or an anode layer. According to an arrangement of the present disclosure, the anti-shrinkage stop structure 504 may be formed by mask patterning, particularly by photoresist coating, exposure, development, etching, photoresist stripping, and the like. However, the present disclosure is not limited thereto, and the anti-shrinkage stop structure 504 may be formed by other patterning processes, such as print, printing, etc. As long as the process can form the desired pattern, the process is the patterning process described in the present disclosure, and can be applied to the present disclosure.

According to an arrangement of the present disclosure, a flexible display low temperature polysilicon film package structure layer (TFE) is taken as an example, the fabrication process of the array segment is the same as in the related art, and the interlayer insulating layer (ILD layer), the source drain layer (SD layer), the planarization layer (PLN layer), and the anode layer are the same as in the related art. The difference lies in that an anti-shrinkage stop structure 504 and an anti-diffusion stop structure 407 are formed at the same layer as the layer where the pixel defining layer 403 (PDL layer) is disposed. The PDL layer can be formed by an exposure technique, as shown in FIG. 6. The fabrication process of the PDL layer is the same as the existing process. The organic light emitting layer (EL common), the cathode layer 306, and the TFE (thin film package structure layer) are the same as in the related art.

With continued reference to FIGS. 5 and 6, according to an arrangement of the present disclosure, the display structure portion may further include a cathode layer 306, projection of the cathode layer 306 on the first surface covers projection of the anti-shrinkage stop structure 504 on the first surface. The thin film encapsulation structure layer 402 may be disposed on the side surface of the cathode layer 306 facing away from the first surface, that is, the outer edge of the cathode layer 306 may be located at the periphery of the anti-shrinkage stop structure 504, the inner side edge of the cathode layer 306 may be located inside the anti-shrinkage stop structure 504.

Referring to FIG. 6, according to an arrangement of the present disclosure, the display structure portion further includes an organic light emitting layer 409 interposed between the cathode layer 306 and the pixel defining layer 403.

According to another aspect of the present disclosure, there is provided a display device including the organic light emitting component provided by the present disclosure. A surface of the thin film encapsulation structure layer 402 of the organic light emitting component is flatter, thus improving uniformity of overall brightness, thus also improving the quality of the display device.

According to another aspect of the present disclosure, a method for fabricating an organic light emitting component includes the following blocks.

In S101, a planarization layer is formed on the substrate, such as but not limited to, sequentially forming a substrate 401, a buffer layer, a gate layer, an insulating layer, and a gate insulating layer (not shown), an interlayer insulating layer, a source-drain electrode, a planarization layer 610 on a glass carrier (not shown).

In S102, a display structure portion and an anti-shrinkage stop structure 504 disposed at a periphery of the display structure portion with an interval are formed on the planarization layer 610 is such as, but not limited to, coating, exposing, and developing the planarization layer 610 to form a pixel definition layer 403 and a pixel defining layer portion 403'; and a cathode layer 306 and a cathode layer portion 306', and a first inorganic structure layer 423 and a first inorganic structure layer portion 423' are sequentially formed.

Figure 7:
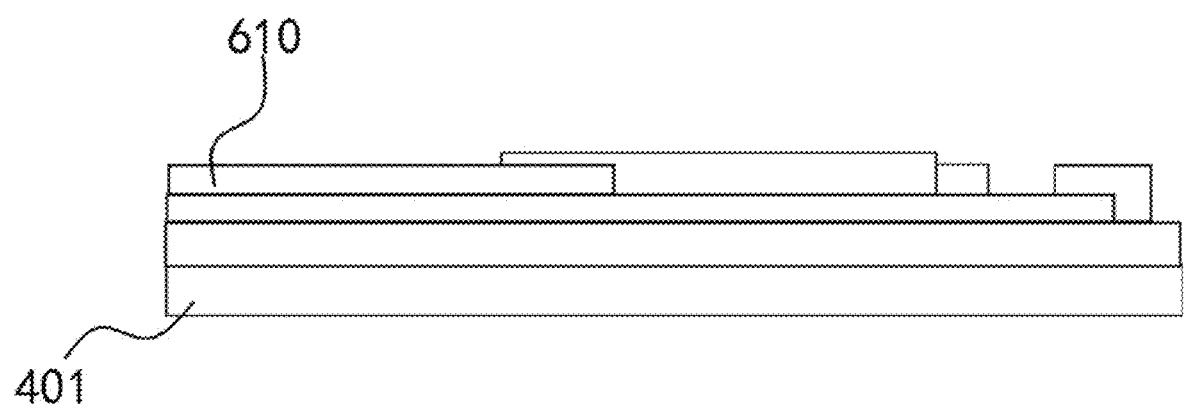
FIG. 7 is flowcharts showing formation of an organic light emitting component according to one or more examples of the present disclosure.
Figure 8:
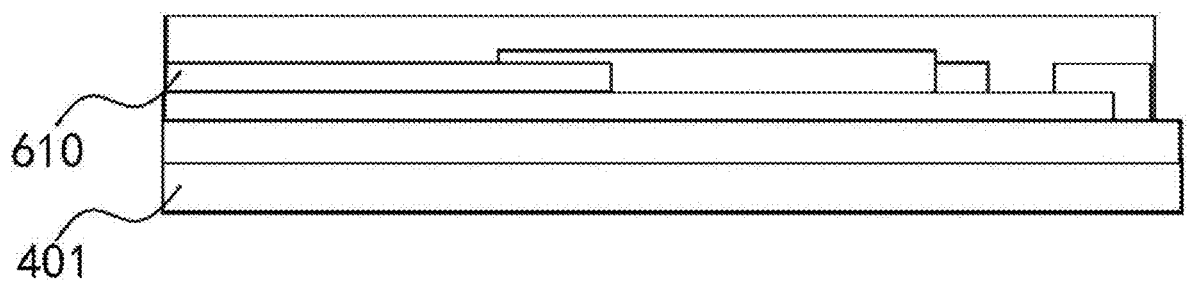
FIG. 8 is flowcharts showing formation of an organic light emitting component according to one or more examples of the present disclosure.
Figure 9:
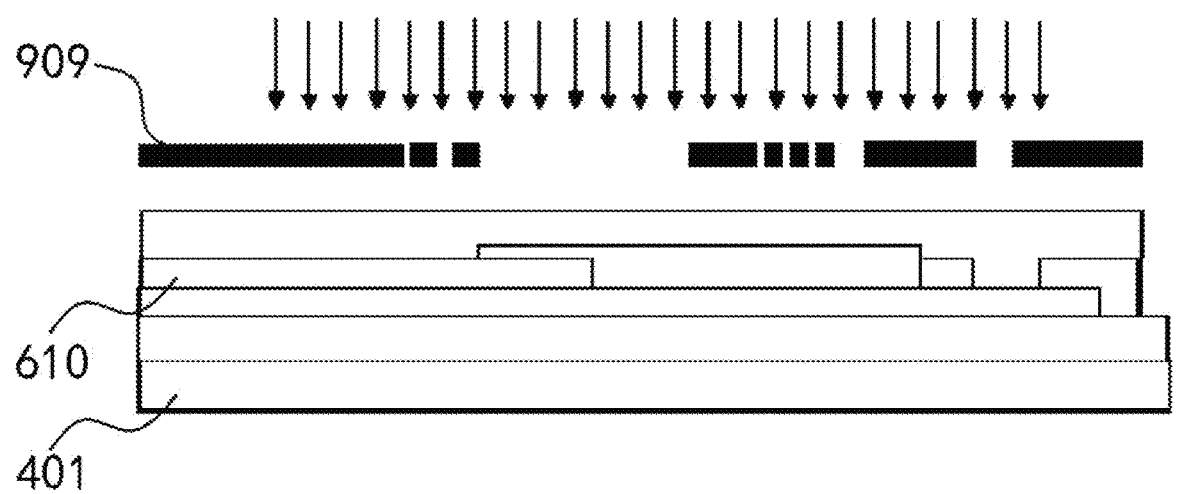
FIG. 9 is flowcharts showing formation of an organic light emitting component according to one or more examples of the present disclosure.
Figure 10:
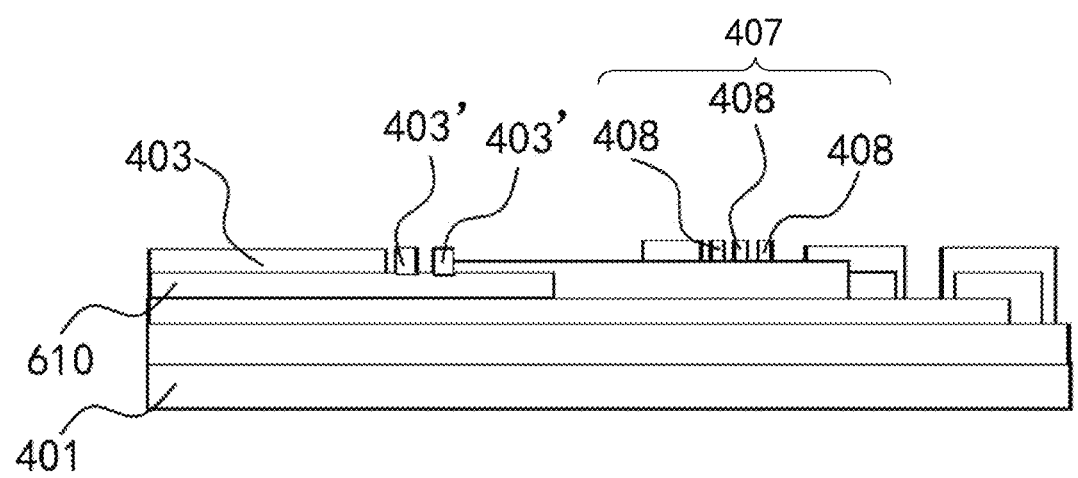
FIG. 10 is flowcharts showing formation of an organic light emitting component according to one or more examples of the present disclosure.
Figure 11:
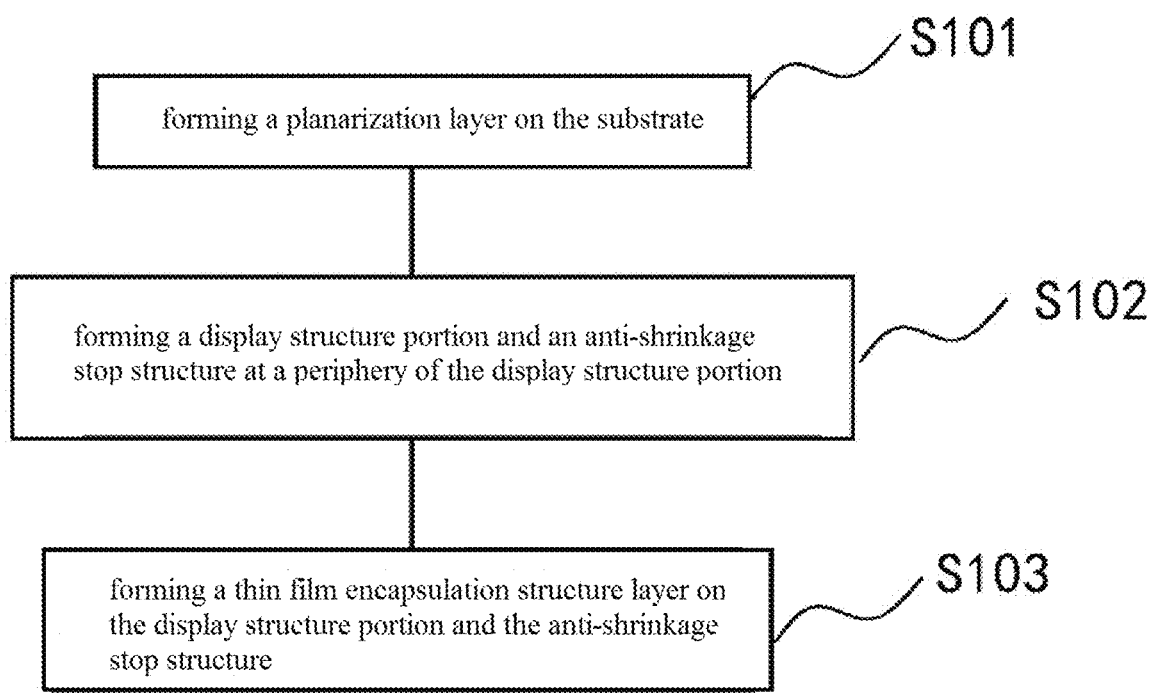
FIG. 11 is a flow chart showing formation of an organic light emitting component according to one or more examples of the present disclosure.

In S103, a thin film encapsulation structure layer is formed on the display structure portion and the anti-shrinkage stop structure 504. As shown in FIG. 7, first, an intermediate structure layer is formed on the substrate 401. The intermediate structure layer may include a planarization layer 610, which may be directly disposed on the substrate 401 or indirectly disposed on the substrate 401, all of which fall within the protection scope of the present disclosure. Then, a coating is performed on the planarization layer 610 to form the structure shown in FIG. 8. Next, referring to FIG. 9 and FIG. 10, the structure formed as shown in FIG. 8 is exposed and developed using a mask 909, to form a pixel defining layer 403 and a pixel defining layer portion 403' and an anti-diffusion stop structure 407 on the structure formed as shown in FIG. 8.

According to an arrangement of the present disclosure, forming the display structure portion and the anti-shrinkage stop structure 504 disposed at a periphery of the display structure portion with an interval on the planarization layer 610 includes:

Performing coating, exposing, and developing on the planarization layer 610 to form a pixel defining layer 403 and a pixel defining layer portion 403'; forming a cathode layer 306 and a cathode layer portion 306' respectively on the pixel defining layer 403 and the pixel defining layer portion 403'; forming a first inorganic structure layer 423 and a first inorganic structure layer portion 423' respectively on the cathode layer 306 and the cathode layer portion 306'. The number of the anti-shrinkage stop structures 504 may be multiple, and the adjacent anti-shrinkage stop structures 504 are sequentially spaced apart from each other.

According to an arrangement of the present disclosure, forming a thin film encapsulation structure layer 402 on the display structure portion and the anti-shrinkage stop structure 504 includes forming an organic structure layer 422 on the display structure portion and the anti-shrinkage stop structure 504; depositing a second inorganic structure layer 421 on the organic structure layer 422, at a position the same as or different from the depositing position of the first inorganic structure layer 423.

According to another arrangement of the present disclosure, a method for fabricating an organic light emitting component further includes providing an anti-diffusion stop structure 407 in the non-display area. The anti-diffusion stop structure 407 surrounds the anti-shrinkage stop structure 504, and the outer edge of the thin film encapsulation structure layer 402 extends to the anti-diffusion stop structure 407. The anti-diffusion stop structure 407 includes a plurality of barrier blocks 408.

It should be noted that "sequentially forming" in the present disclosure may refer to forming in a predetermined order, and adjacent components may be directly adjacent to each other or may be indirectly adjacent to each other, all of which fall within the protection scope of the disclosure. For example, but not limited to, in one arrangement of the present disclosure, the substrate 401 and the interlayer insulating layer may be indirectly adjacent to each other.

According to one aspect of the present disclosure, there is provided an organic light emitting component. The organic light emitting component includes a substrate, an intermediate structure layer and a thin film encapsulation structure. The substrate includes a first surface. The intermediate structure layer is disposed on the first surface of the substrate. The intermediate structure layer includes a display area and a non-display area at a periphery of the display area. The display area is provided with a display structure portion. The non-display area is provided with one or more anti-shrinkage stop structures. The intermediate structure layer further includes a planarization layer. The anti-shrinkage stop structure and the display structure portion are both disposed on the planarization layer and spaced apart from each other. The organic light emitting component includes a thin film encapsulation structure layer located on a surface of the intermediate structure layer facing away from the substrate. The anti-shrinkage stop structure is disposed between the thin film encapsulation structure layer and the planarization layer, and a free end of the anti-shrinkage stop structure extends into the thin film encapsulation structure layer.

According to an arrangement of the present disclosure, the display structure portion includes a pixel defining layer, an organic light emitting layer, a cathode layer and a first inorganic structure layer, which are sequentially stacked. The pixel defining layer is disposed on the planarization layer, and the organic light emitting layer is disposed on a surface of the pixel defining layer facing away from the planarization layer.

According to an arrangement of the present disclosure, the number of the one or more anti-shrinkage stop structures is multiple, and the plurality of anti-shrinkage stop structures are arranged in at least one circle, and adjacent two circles are spaced apart from each other.

According to an arrangement of the present disclosure, a number of the one or more anti-shrinkage stop structures is 1 to 5.

According to an arrangement of the present disclosure, the non-display area is provided with an anti-diffusion stop structure. The anti-diffusion stop structure surrounds the one or more anti-shrinkage stop structures. An outer edge of the thin film encapsulation structure layer extends to the anti-diffusion stop structure.

According to an arrangement of the present disclosure, the anti-diffusion stop structure includes a plurality of barrier blocks disposed with a gap from each other. The plurality of barrier blocks are arranged in at least one circle and adjacent two circles are spaced apart from each other.

According to an arrangement of the present disclosure, the one or more anti-shrinkage stop structures each includes a pixel defining layer portion, a cathode layer portion, and a first inorganic structure layer portion, which are sequentially stacked. The pixel defining layer portion is disposed on the planarization layer, and the cathode layer portion is disposed on a surface of the pixel defining layer portion facing away from the planarization layer.

According to an arrangement of the present disclosure, the one or more anti-shrinkage stop structures are formed by a patterning process.

According to an arrangement of the present disclosure, the thin film encapsulation structure layer includes a second inorganic structure layer and an organic structure layer, which are sequentially stacked. The organic structure layer is on the intermediate structure layer and is in contact with the intermediate structure layer. The free end of the one or more anti-shrinkage stop structures extends into the organic structure layer.

According to another aspect of the present disclosure, there is provided a display device, including the organic light emitting component provided by the present disclosure.

According to another aspect of the present disclosure, there is provided a method for fabricating an organic light emitting component. The method for fabricating the organic light emitting component includes forming a planarization layer on the substrate. The method includes forming a display structure portion and one or more anti-shrinkage stop structures at a periphery of the display structure portion with an interval on the planarization layer. The method includes forming a thin film encapsulation structure layer on the display structure portion and the one or more anti-shrinkage stop structures.

According to an arrangement of the present disclosure, forming the display structure portion and the one or more anti-shrinkage stop structures at the periphery of the display structure portion with the interval on the planarization layer further includes coating, exposing, and developing on the planarization layer to form a pixel defining layer and a pixel defining layer portion. Such a block further includes forming a cathode layer and a cathode layer portion respectively on the pixel defining layer and the pixel defining layer portion, and forming a first inorganic structure layer and a first inorganic structure layer portion respectively on the cathode layer and the cathode layer portion.

According to an arrangement of the present disclosure, forming the thin film encapsulation structure layer on the display structure portion and the one or more anti-shrinkage stop structures further includes forming an organic structure layer on the display structure portion and the one or more anti-shrinkage stop structures, and depositing a second inorganic structure layer on the organic structure layer. The second inorganic structure layer is deposited at the same or different position as that of the first inorganic structure layer.

According to an arrangement of the present disclosure, the number of the one or more anti-shrinkage stop structure is multiple. Adjacent ones of the one or more anti-shrinkage stop structures are sequentially spaced apart from each other.

According to an arrangement of the present disclosure, the method for fabricating the organic light emitting component further includes disposing an anti-diffusion stop structure in the non-display area. The anti-diffusion stop structure surrounds the one or more anti-shrinkage stop structures, and an outer edge of the thin film encapsulation structure layer extends to the anti-diffusion stop structure.

According to an arrangement of the present disclosure, the one or more anti-diffusion stop structures each includes a plurality of barrier blocks disposed with a gap from each other. The plurality of barrier blocks are arranged in at least one circle, and adjacent two circles are spaced apart from each other.

The above description is only the specific arrangement of the present disclosure, but the scope of the present disclosure is not limited thereto, variations or substitutions readily conceived by any person skilled in the art within the technical scope of the disclosure should be covered within the scope of protection of the present disclosure. Therefore, the scope of protection of the present disclosure should be determined by the scope of the claims.

What is claimed is:
1. An organic light emitting component, comprising:
a substrate comprising a first surface;
an intermediate structure layer disposed on the first surface of the substrate, wherein the intermediate structure layer comprises a display area and a non-display area at a periphery of the display area, the display area is provided with a display structure portion, the non-display area is provided with one or more first structures, the intermediate structure layer further comprises a planarization layer, the one or more first structures and the display structure portion are both disposed on the planarization layer and spaced apart from each other; and
a thin film encapsulation structure layer located on a surface of the intermediate structure layer facing away from the substrate, wherein the one or more first structures are between the thin film encapsulation structure layer and the planarization layer, and a free end of the one or more first structures extends into the thin film encapsulation structure layer, wherein the thin film encapsulation structure layer comprises a second inorganic structure layer and an organic structure layer which are sequentially stacked, and the organic structure layer is on the intermediate structure layer,
wherein the display structure portion comprises a pixel defining layer, an organic light emitting layer, a cathode layer and a first inorganic structure layer; the pixel defining layer, the organic light emitting layer, the cathode layer and the first inorganic structure layer are sequentially stacked; the pixel defining layer is disposed on the planarization layer; and the organic light emitting layer is disposed on a surface of the pixel defining layer facing away from the planarization layer;
the non-display area is provided with a second structure, the second structure surrounds the one or more first structures, and an outer edge of the thin film encapsulation structure layer extends to the second structure; and
the one or more first structures and the second structure are formed at a same layer as a layer where the pixel defining layer is disposed; wherein the one or more first structures and the pixel defining layer are out of contact;
wherein the free end of the one or more first structures extends into the organic structure layer.
2. The organic light emitting component according to claim 1, wherein the organic structure layer is in contact with the intermediate structure layer.
3. The organic light emitting component according to claim 1, wherein a number of the one or more first structures is more than one, and the one or more first structures are arranged in at least one of a plurality of circles, and adjacent ones of the plurality of circles are spaced apart from each other.
4. The organic light emitting component according to claim 1, wherein a number of the one or more first structures is 1 to 5.

5. The organic light emitting component according to claim 1, wherein the second structure comprises a plurality of barrier blocks disposed with a gap between each other, the plurality of barrier blocks are arranged in at least one circle and adjacent two circles are spaced apart from each other.

6. The organic light emitting component according to claim 1, wherein the one or more first structures comprise a pixel defining layer portion, a cathode layer portion, and a first inorganic structure layer portion which are sequentially stacked, the pixel defining layer portion is on the planarization layer, and the cathode layer portion is on a surface of the pixel defining layer portion facing away from the planarization layer.

7. The organic light emitting component according to claim 1, wherein the one or more first structures are formed by a patterning process.

8. The organic light emitting component according to claim 1, wherein the one or more first structures are formed by the planarization layer outwardly protruding.

9. The organic light emitting component according to claim 1, wherein the first structures are sequentially spaced around a periphery of the pixel defining layer.

10. A display device, comprising an organic light emitting component, the organic light emitting component comprising:
a substrate comprising a first surface;
an intermediate structure layer disposed on the first surface of the substrate, wherein the intermediate structure layer comprises a display area and a non-display area at a periphery of the display area, the display area is provided with a display structure portion, the non-display area is provided with one or more first structures, the intermediate structure layer further comprises a planarization layer, the one or more first structures and the display structure portion are both disposed on the planarization layer and spaced apart from each other; and
a thin film encapsulation structure layer located on a surface of the intermediate structure layer facing away from the substrate, wherein the one or more first structures are disposed between the thin film encapsulation structure layer and the planarization layer, and a free end of the one or more first structures extends into the thin film encapsulation structure layer, wherein the thin film encapsulation structure layer comprises a second inorganic structure layer and an organic structure layer which are sequentially stacked, and the organic structure layer is on the intermediate structure layer,
wherein the display structure portion comprises a pixel defining layer, an organic light emitting layer, a cathode layer and a first inorganic structure layer; the pixel defining layer, the organic light emitting layer, the cathode layer and the first inorganic structure layer are sequentially stacked; the pixel defining layer is disposed on the planarization layer; and the organic light emitting layer is disposed on a surface of the pixel defining layer facing away from the planarization layer;
the non-display area is provided with a second structure, the second structure surrounds the one or more first structures, and an outer edge of the thin film encapsulation structure layer extends to the second structure; and
the one or more first structures and the second structure are formed at a same layer as a layer where the pixel defining layer is disposed; wherein the one or more first structures and the pixel defining layer are out of contact;
wherein the free end of the one or more first structures extends into the organic structure layer.

11. The organic light emitting component according to claim 10, wherein the organic structure layer is in contact with the intermediate structure layer.

12. The organic light emitting component according to claim 10, wherein the one or more first structures are formed by the planarization layer outwardly protruding.

13. The display device according to claim 10, wherein the first structures are sequentially spaced around a periphery of the pixel defining layer.

14. A method for fabricating an organic light emitting component, comprising:
providing a substrate comprising a first surface;
disposing an intermediate structure layer on the first surface of the substrate, wherein the intermediate structure layer comprises a display area and a non-display area at a periphery of the display area, the display area is provided with a display structure portion, the non-display area is provided with one or more first structures, the intermediate structure layer further comprises a planarization layer, and the one or more first structures and the display structure portion are both disposed on the planarization layer and spaced apart from each other; and
providing a thin film encapsulation structure layer located on a surface of the intermediate structure layer facing away from the substrate, wherein the one or more first structures are disposed between the thin film encapsulation structure layer and the planarization layer, and a free end of the one or more first structures extends into the thin film encapsulation structure layer, wherein the thin film encapsulation structure layer comprises a second inorganic structure layer and an organic structure layer which are sequentially stacked, and the organic structure layer is on the intermediate structure layer,
wherein the display structure portion comprises a pixel defining layer, an organic light emitting layer, a cathode layer and a first inorganic structure layer; the pixel defining layer, the organic light emitting layer, the cathode layer and the first inorganic structure layer are sequentially stacked; the pixel defining layer is disposed on the planarization layer; and the organic light emitting layer is disposed on a surface of the pixel defining layer facing away from the planarization layer;
the non-display area is provided with a second structure, the second structure surrounds the one or more first structures, and an outer edge of the thin film encapsulation structure layer extends to the second structure; and
the one or more first structures and the second structure are formed at a same layer as a layer where the pixel defining layer is disposed; wherein the one or more first structures and the pixel defining layer are out of contact;
wherein the free end of the one or more first structures extends into the organic structure layer;
the method for fabricating the organic light emitting component further comprising:
forming the planarization layer on the substrate;
forming the display structure portion and the one or more first structures at the periphery of the display structure portion with an interval on the planarization layer; and forming the thin film encapsulation structure layer on the display structure portion and the one or more first structures.

15. The method for fabricating the organic light emitting component according to claim 14, wherein forming the display structure portion and the one or more first structures at the periphery of the display structure portion with an interval on the planarization layer comprises:
   coating, exposing, and developing on the planarization layer to form a pixel defining layer and a pixel defining layer portion;
   forming a cathode layer and a cathode layer portion on the pixel defining layer and the pixel defining layer portion; and
   forming a first inorganic structure layer and a first inorganic structure layer portion on the cathode layer and the cathode layer portion.

16. The method for fabricating the organic light emitting component according to claim 15, wherein forming the thin film encapsulation structure layer on the display structure portion and the one or more first structures comprises:
   forming an organic structure layer on the display structure portion and the one or more first structures; and
   depositing a second inorganic structure layer on the organic structure layer, the second inorganic structure layer being deposited at the same or different position as that of the first inorganic structure layer.

17. The method for fabricating the organic light emitting component according to claim 14, wherein a number of the one or more first structure is more than one, and adjacent ones of the one or more first structures are sequentially spaced apart from each other.

18. The method for fabricating the organic light emitting component according to claim 15, further comprising:
   disposing the second structure in the non-display area, wherein the second structure surrounds the one or more anti-shrinkage stop structures, and an outer edge of the thin film encapsulation structure layer extends to the second structure.

19. The method for fabricating the organic light emitting component according to claim 14, further comprising:
   disposing the second structure in the non-display area, wherein the second structure surrounds the one or more first structures, and an outer edge of the thin film encapsulation structure layer extends to the second structure.

20. The method for fabricating the organic light emitting component according to claim 19, wherein the second structure comprises a plurality of barrier blocks disposed with a gap between each other, the plurality of barrier blocks are arranged in at least one circle, and adjacent two circles are spaced apart from each other.

* * * * *